(12) United States Patent
Hiner et al.

(10) Patent No.: US 7,028,400 B1
(45) Date of Patent: Apr. 18, 2006

(54) INTEGRATED CIRCUIT SUBSTRATE HAVING LASER-EXPOSED TERMINALS

(75) Inventors: David Jon Hiner, Chandler, AZ (US); Ronald Patrick Huemoeller, Chandler, AZ (US); Sukianto Rusli, Phoenix, AZ (US)

(73) Assignee: Amkor Technology, Inc., Chandler, AZ (US)

( * ) Notice: Subject to any disclaimer, the term of this patent is extended or adjusted under 35 U.S.C. 154(b) by 213 days.

(21) Appl. No.: 10/603,878

(22) Filed: Jun. 24, 2003

Related U.S. Application Data (63) Continuation-in-part of application No. 10/138,225, filed on May 1, 2002, now Pat. No. 6,930,256, and a continuation-in-part of application No. 10/392,737, filed on Mar. 19, 2003, now abandoned.

(51) Int. Cl.
*H01K 3/10* (2006.01)

(52) U.S. Cl. .......................... 29/852; 29/825; 29/832; 29/840; 427/96.1; 427/97.1

(58) Field of Classification Search ................. 29/830, 29/846, 847, 852, 853, 825, 832, 840
See application file for complete search history.

(56) References Cited

U.S. PATENT DOCUMENTS

| | | | |
|---|---|---|---|
| 4,322,778 A | | 3/1982 | Barbour et al. |
| 4,642,160 A | * | 2/1987 | Burgess ....................... 216/18 |
| 4,685,033 A | | 8/1987 | Inoue |
| 4,811,082 A | | 3/1989 | Jacobs et al. |
| 4,964,212 A | * | 10/1990 | Deroux-Dauphin et al. .. 29/852 |
| 5,021,047 A | | 6/1991 | Movern |
| 5,072,075 A | | 12/1991 | Lee et al. |
| 5,108,553 A | * | 4/1992 | Foster et al. ................. 205/125 |
| 5,191,174 A | | 3/1993 | Chang et al. |
| 5,229,550 A | | 7/1993 | Birdra et al. |
| 5,239,448 A | | 8/1993 | Perkins et al. |
| 5,404,044 A | | 4/1995 | Booth et al. |
| 5,508,938 A | | 4/1996 | Wheeler |
| 5,774,340 A | | 6/1998 | Chang et al. |
| 5,826,330 A | * | 10/1998 | Isoda et al. .................... 29/852 |
| 5,847,453 A | | 12/1998 | Uematsu et al. |
| 6,004,619 A | * | 12/1999 | Dippon et al. ................. 29/852 |
| 6,021,564 A | * | 2/2000 | Hanson ........................ 29/852 |

(Continued)

OTHER PUBLICATIONS

IBM Tech Disc. Bull Microstructure Solder Mask by Means of a Laser, vol. 36, Issue 11, p. 589, Nov. 1, 1993.

*Primary Examiner*—Carl J. Arbes
(74) *Attorney, Agent, or Firm*—Weiss, Moy & Harris, P.C.

(57) ABSTRACT

An integrated circuit substrate having laser-exposed terminals provides a high-density and low cost mounting and interconnect structure for integrated circuits. The laser-exposed terminals can further provide a selective plating feature by using a dielectric layer of the substrate to prevent plating terminal conductors and subsequently exposing the terminals via laser ablation. A metal layer may be coated on one or both sides with a dielectric material, conductive material embedded within the dielectric to form conductive interconnects and then coating over the conductive material with a conformal protective coating. The protectant is then laser-ablated to expose the terminals. A dielectric film having a metal layer laminated on one side may be etched and plated. Terminals are then laser-exposed from the back side of the metal layer exposing unplated terminals.

20 Claims, 6 Drawing Sheets

U.S. PATENT DOCUMENTS

| | | |
|---|---|---|
| 6,081,036 A | 6/2000 | Hirano et al. |
| 6,119,338 A * | 9/2000 | Wang et al. ................... 29/852 |
| 6,175,087 B1 | 1/2001 | Keesler et al. |
| 6,204,453 B1 | 3/2001 | Fallon et al. |
| 6,239,485 B1 | 5/2001 | Peters et al. |
| 6,280,641 B1 * | 8/2001 | Gaku et al. ................... 216/17 |
| 6,351,031 B1 | 2/2002 | Iijima et al. |
| 6,353,999 B1 * | 3/2002 | Cheng ........................ 29/852 |
| 6,365,975 B1 | 4/2002 | DiStefano et al. |
| 6,376,906 B1 | 4/2002 | Asai et al. |
| 6,405,431 B1 * | 6/2002 | Shin et al. ................... 29/852 |
| 6,534,391 B1 | 3/2003 | Huemoeller et al. |
| 6,608,757 B1 | 8/2003 | Bhatt et al. |
| 6,660,559 B1 | 12/2003 | Huemoeller et al. |
| 6,715,204 B1 * | 4/2004 | Tsukada et al. ............... 29/847 |
| 6,787,443 B1 * | 9/2004 | Boggs et al. ............... 438/612 |
| 6,803,528 B1 * | 10/2004 | Koyanagi ................... 174/262 |
| 6,815,709 B1 | 11/2004 | Clothier et al. |

\* cited by examiner

INTEGRATED CIRCUIT SUBSTRATE HAVING LASER-EXPOSED TERMINALS

CROSS-REFERENCE TO RELATED APPLICATIONS

The present application is a continuation-in-part of U.S. patent application entitled "INTEGRATED CIRCUIT SUBSTRATE HAVING LASER-EMBEDDED CONDUCTIVE PATTERNS AND METHOD THEREFOR", Ser. No. 10/138,225 filed May 1, 2002, now U.S. Pat. No. 6,930,256, having at least one common inventor and assigned to the same assignee.

The present application is also a continuation-in-part of U.S. patent application entitled "INTEGRATED CIRCUIT SUBSTRATE HAVING EMBEDDED BACK-SIDE ACCESS CONDUCTORS AND VIAS", Ser. No. 10/392,737 filed Mar. 19, 2003, now abandoned, by the same inventors and assigned to the same assignee. The specifications of the above-referenced patent applications are herein incorporated by reference.

FIELD OF THE INVENTION

The present invention relates generally to semiconductor packaging, and more specifically, to a substrate having laser ablated terminals for conductors for providing an electrical interface between a die and external terminals in an integrated circuit package.

BACKGROUND OF THE INVENTION

Semiconductors and other electronic and opto-electronic assemblies are fabricated in groups on a wafer. Known as "dies", the individual devices are cut from the wafer and are then bonded to a carrier. The dies must be mechanically mounted and electrically connected to a circuit.

The above-incorporated patent application "INTEGRATED CIRCUIT SUBSTRATE HAVING LASER-EMBEDDED CONDUCTIVE PATTERNS AND METHOD THEREFOR" provides increased conductor density and decreased inter-conductor spacing via laser-embedded circuit technologies, but still has a terminal pitch limitation dictated by traditional masking techniques (if any are used) for masking the wirebond points and ball/land grid array terminal mounting points of the exposed copper at the surfaces of the substrate.

The above-incorporated patent application "INTEGRATED CIRCUIT SUBSTRATE HAVING EMBEDDED BACK-SIDE ACCESS CONDUCTORS AND VIAS" provides increased conductor density and lower manufacturing cost by using a prefabricated substrate having metal plated, printed or etched on a dielectric. However, a solder mask is required to prevent plating of the ball/land grid array terminals during the plating process, adding an additional step to the overall manufacturing process. Additionally, other techniques commonly in use for selectively plating wire bonding areas with a Ni/Au or other plating material commonly use a resist process to mask off the ball/land grid array terminals that would otherwise be exposed after the substrate has been drilled or punched.

Therefore, it would be desirable to provide methods and substrates having improved interconnect density with a low associated manufacturing cost. It would further be desirable to provide a method and substrate wherein external terminals of a substrate may be selectively plated without requiring a masking or resist process.

SUMMARY OF THE INVENTION

The above objectives of providing improved interconnect density and a low associated manufacturing cost and providing improvements in selectively plating terminals without a masking or resist process are provided in a substrate and method for manufacturing a substrate. Laser-ablation is used to remove a coating or drill holes through a substrate to expose the terminals after plating and other manufacturing procedures have been completed.

Unplated terminals may be generated on a dielectric film having a laminated metal layer by imaging and etching the metal layer and then dip-plating without the use of any plating resistive material. The terminals are laser-exposed by ablating the film from the back-side of the metal layer to form terminal connection points.

Alternatively, a metal layer may be coated with a dielectric material on one or both sides and laser-embedded conductors placed in the dielectric layers and covered with a conformal coating. Wirebond and/or ball/land grid array terminals are laser-exposed by ablating the conformal coating only above the terminals, providing a protected surface having only the terminal locations exposed.

BRIEF DESCRIPTION OF THE DRAWINGS

The invention, as well as a preferred mode of use and advantages thereof, will best be understood by reference to the following detailed description of illustrative embodiments when read in conjunction with the accompanying drawings, wherein like reference numerals indicate like parts throughout.

DETAILED DESCRIPTION

Referring now to the figures and in particular to FIGS. 1A through 1G, a cross-sectional view of stages of preparation of a substrate in accordance with an embodiment of the present invention is shown. A first substrate stage 10A, having a dielectric layer 12 and an adhesive layer 14 disposed thereon is punched to add sprocket holes 16 forming substrate stage 10B of FIG. 1B. Sprocket holes 16 are added for machine feeding the substrate stages, which are generally formed on a continuous tape, through processing machines for performing the method that prepares the substrate of the present embodiment. Substrate stage 10A may be fabricated from a dielectric film tape such as a polymide film. Alternatively, substrate stage 10A may be fabricated from a rigid or semi-rigid dielectric material such as polyimide resin having, in accordance with another embodiment of the present invention. Suitable tape materials are KAPTON, APICAL, UPILEX and various liquid crystal polymers (LCPs) may also be used to form the core of the substrate of the present invention. Rigid substrate layers may be cured epoxy resin, FR4, or other substrate materials commonly used to form integrated circuit substrates.

Figure 1A:
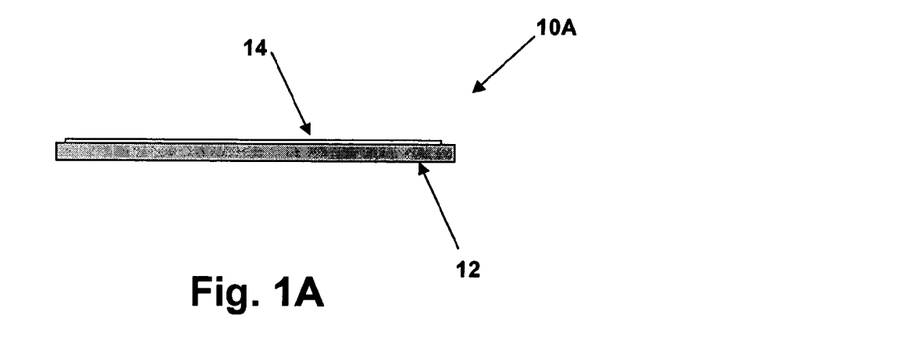
FIGS. 1A–1G are pictorial diagrams depicting a cross-sectional view of stages of preparation of an integrated circuit substrate in accordance with an embodiment of the present invention.
Figure 1B:
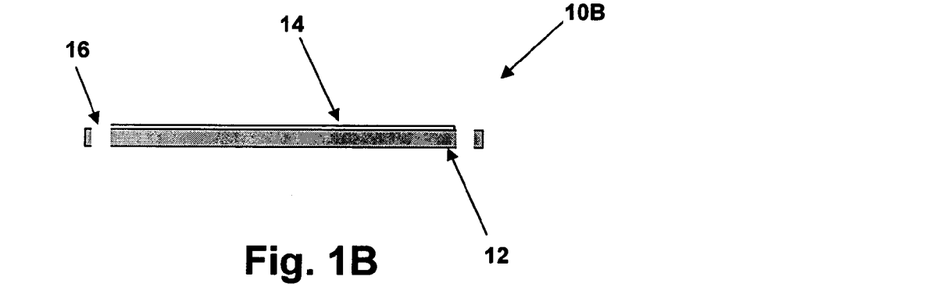
Figure 1C:
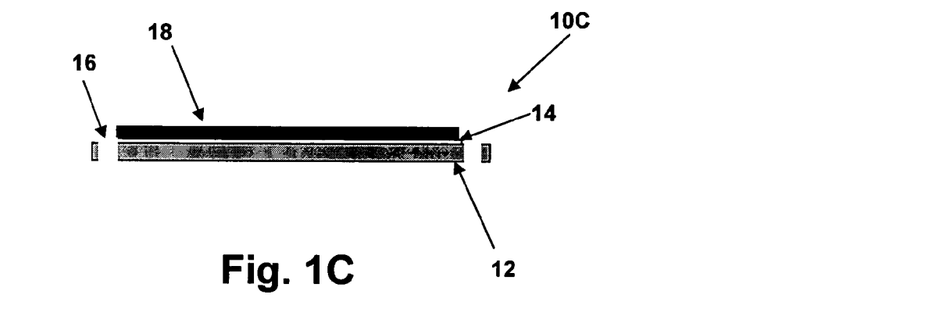
Figure 1D:
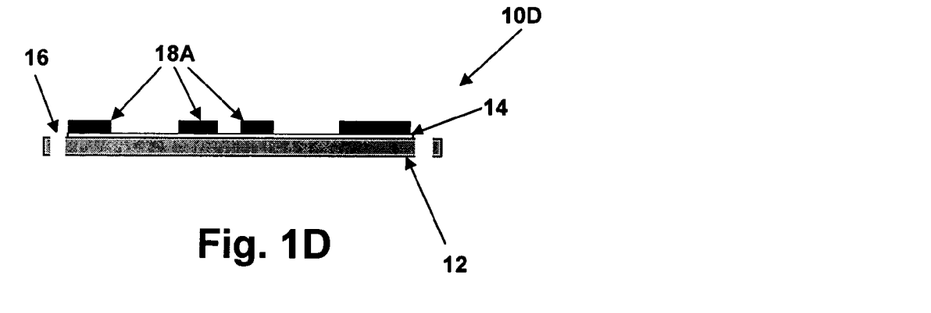

Next, a metal conductive layer 18 (generally a copper film) is laminated to substrate stage 10B, using adhesive layer 14 to secure the lamination forming substrate stage 10C of FIG. 1C. Substrate 10C is imaged and etched for form a conductive pattern 18A yielding substrate stage 10D of FIG. 1D. Substrate state 1D is then immersion plated to deposit a plating forming plated conductive pattern 18B (generally Ni/Au) on conductive pattern 18A yielding substrate stage 10E of FIG. 1E. Unique to the method and structure of substrate stage 10E is that no masking is required to selectively plate conductive pattern, which is done for environmental protection and to yield wire-bondable contact surfaces on conductive pattern 18B. It is desirable not to plate solder terminal locations, as eventual diffusion of gold into the solder bond weakens the solder bond, causing early failures due to fracture. Because the solder ball terminals for the external contacts of substrate stage 10D have not been exposed, substrate stage 10D can be plated without masking to yield substrate stage 10E without plating the external contact terminals.

Figure 1E:
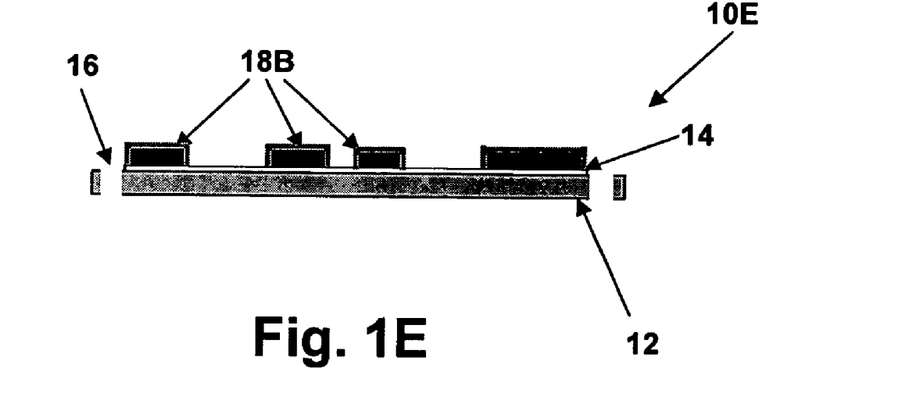
Figure 1F:
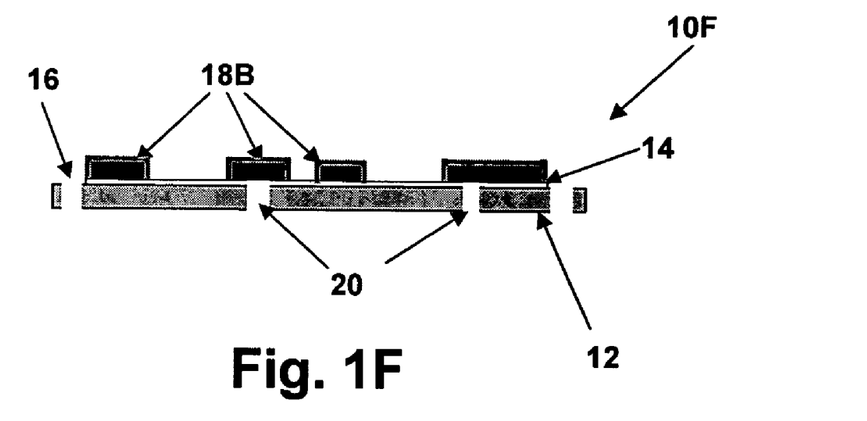
Figure 1G:
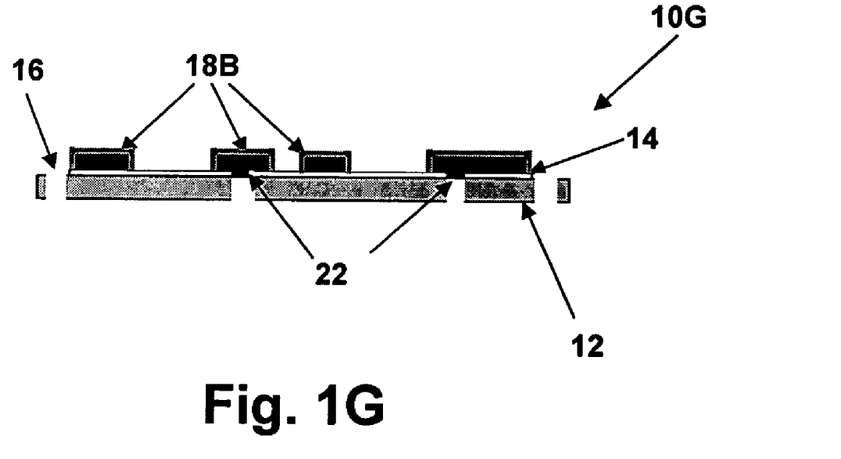

Next, substrate stage 10E is laser-ablated from the back side to expose terminals for solder ball attach through holes 20 yielding substrate stage 10F. Finally, substrate stage 10F is dipped in an organic solderable protectant (OSP) that coats the terminal locations 22, yielding final substrate 10G.

The above-described process yields an advantage over prior solutions that typically punch all voids in dielectric layer 12 when sprocket holes 16 are punched. Then, in order to selectively plate the conductive pattern (without plating the solder ball terminals) a plating mask is applied through the solder ball terminal holes. The method of the present invention and the consequent resulting structure, provides an advantage of eliminating the masking step in order to produce substrate 1G without gold present in the terminal/solder interfaces.

Figure 2A:
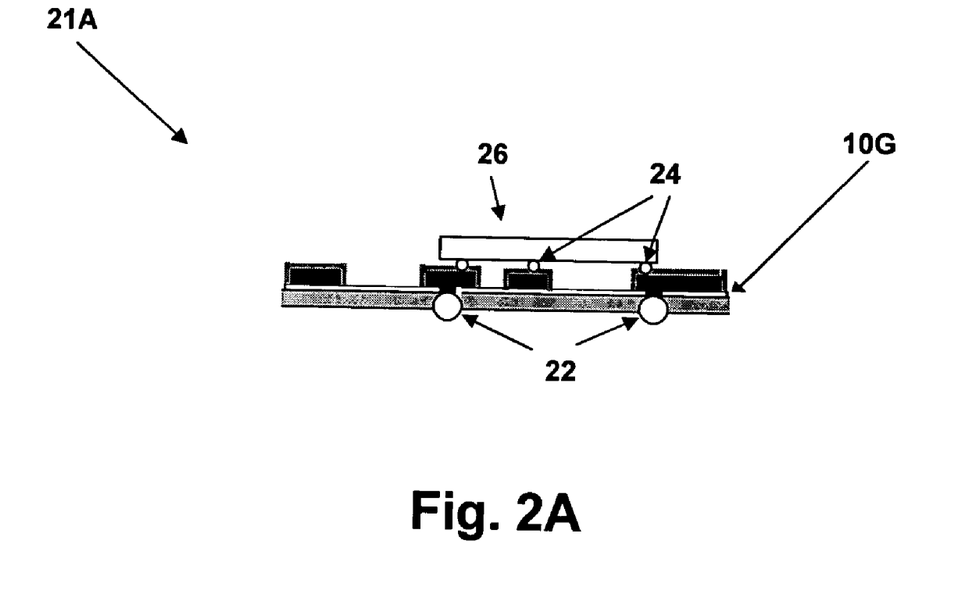
FIGS. 2A and 2B are pictorial diagrams depicting integrated circuits in accordance with embodiments of the present invention.

Referring now to FIG. 2A, an integrated circuit 21A, in accordance with an embodiment of the invention is shown. A die 26 is mounted on substrate 10G via a plurality of solder balls or posts 24 in a flip-chip configuration. External terminal solder balls 22 are added to the external terminal locations forming a complete integrated circuit package that may be subsequently encapsulated.

Figure 2B:
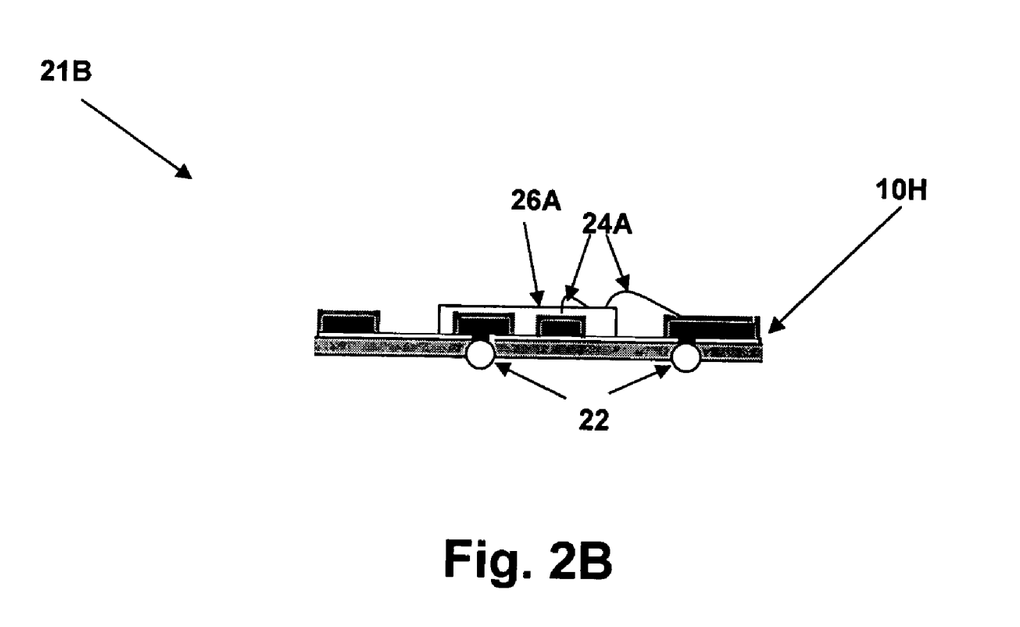

Referring now to FIG. 2B, another integrated circuit 21B is shown exemplifying a wire bonded configuration. A die 26A is mounted to substrate 10H with an adhesive (generally epoxy) and wires 24A are bonded between plated lands on the conductive pattern side of substrate 10H. Solder balls 22 are added to the external terminal locations. Substrate 10H is manufactured according to the same steps as substrate 10G, but has a different circuit pattern and die mounting area for accommodating wire-attach type die 26A.

Figure 3A:
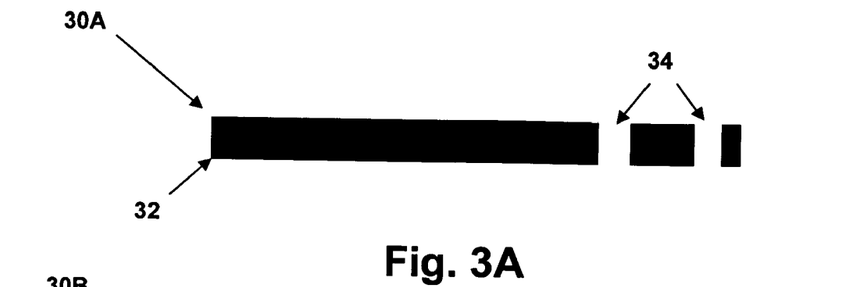
FIGS. 3A–3G are a pictorial diagrams depicting a cross-sectional view of stages of preparation of an integrated circuit substrate in accordance with another embodiment of the present invention.
Figure 3B:
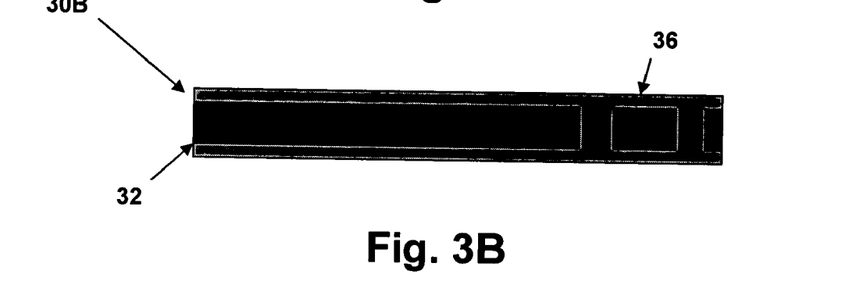

Referring now to FIGS. 3A–3G, stages of preparation of a substrate in accordance with another embodiment of the invention are shown. A first stage of preparation of substrate 30A is shown as a metal layer 32, which is etched to provide holes 34. Metal layer 32 is generally a copper core that may be etched or die-cut, but other suitable metal layers may be used for form the core of the substrate of the present invention, such as a copper-INVAR-copper laminate. The ratio of copper to Invar can be varied to provide adjustment of the coefficient of thermal expansion (CTE) of the substrate. Holes 34 are generated in metal layer 32 to permit the passage of circuit paths through metal layer 320, while avoiding electrical contact with metal layer 32. Referring now to FIG. 3B, the second stage of preparation forming substrate stage 30B is shown. A dielectric outer layer 36 has been added to the top and bottom surface of metal layer 32 and can be provided by injection molding a plastic material around metal layer 32 or by laminating a dielectric such as KAPTON film or PTFE on each side of metal layer 32.

Figure 3C:
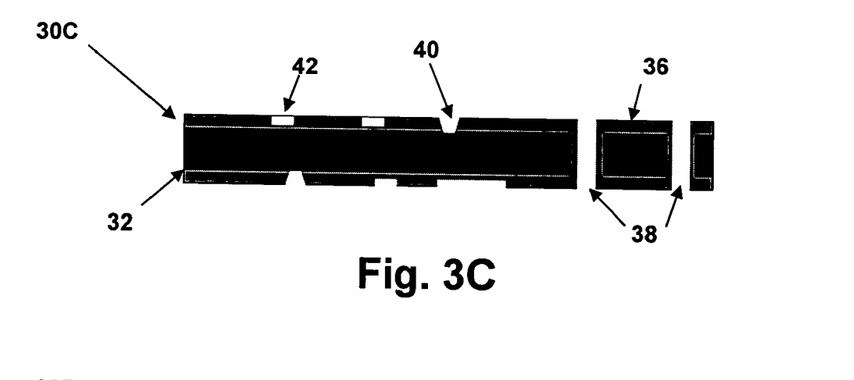

Referring now to FIG. 3C, the next stage is depicted. Substrate 30B is laser-ablated to form substrate 30C having vias 38, blind vias 40 and conductor channels 42. Blind vias 40 show a conical shape, which is preferred for addition of conductive material and can be generated by varying the laser angle or beam diameter as dielectric material 36 is ablated.

Figure 3D:
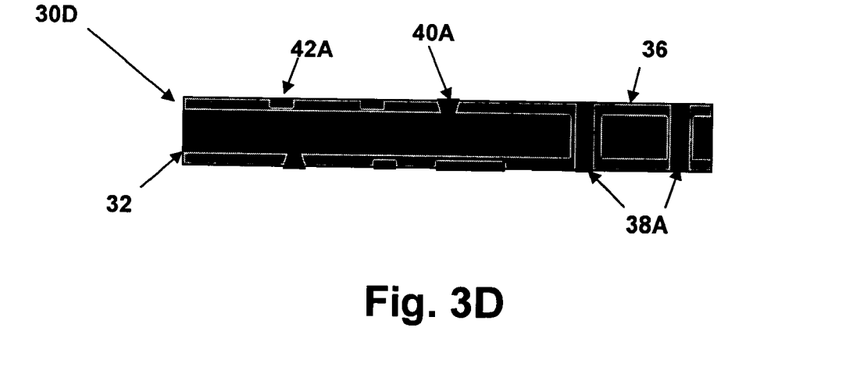

Next, referring to FIG. 3D, the next step in the preparation of substrate 30C providing a substrate 30D having conductive circuit paths. Conductive material is added within channels 42, blind vias 40 and through vias 38 to provide conductive paths 42A conductive blind vias 40A and conductive through vias 38A. The conductive material may be a silver or copper paste that is screen printed into channels 42, blind vias 40 and through vias 38, and planarized to remove conductive material on the surface of outer dielectric layer 36 after printing. Alternatively, an electroplating process (generally copper electroplate) can be used to add conductive material within channels 42, blind vias 40 and through vias 38 and a planarization process or chemical etching process can be used to remove excess conductive material on the surface of dielectric layer 36.

Figure 3E:
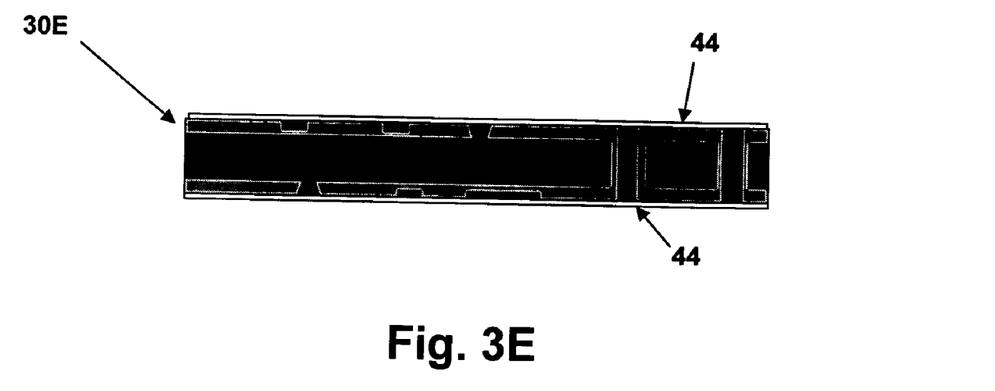
Figure 3F:
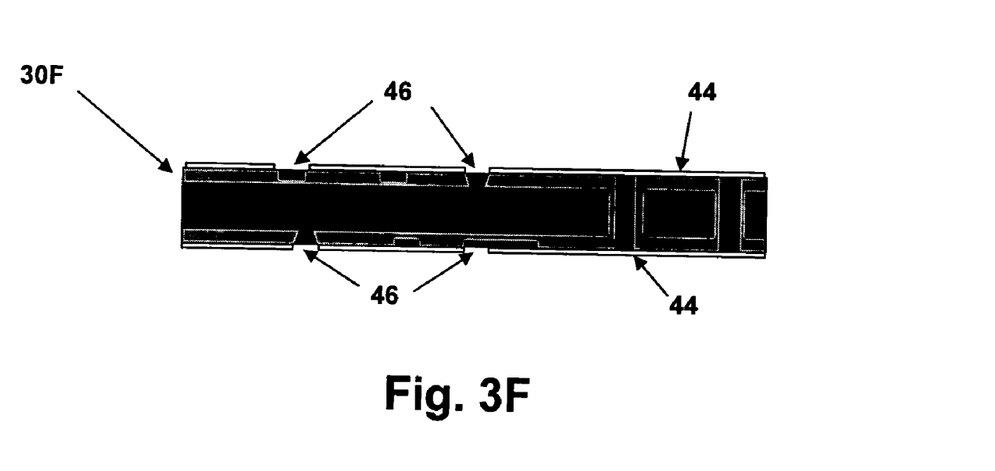
Figure 3G:
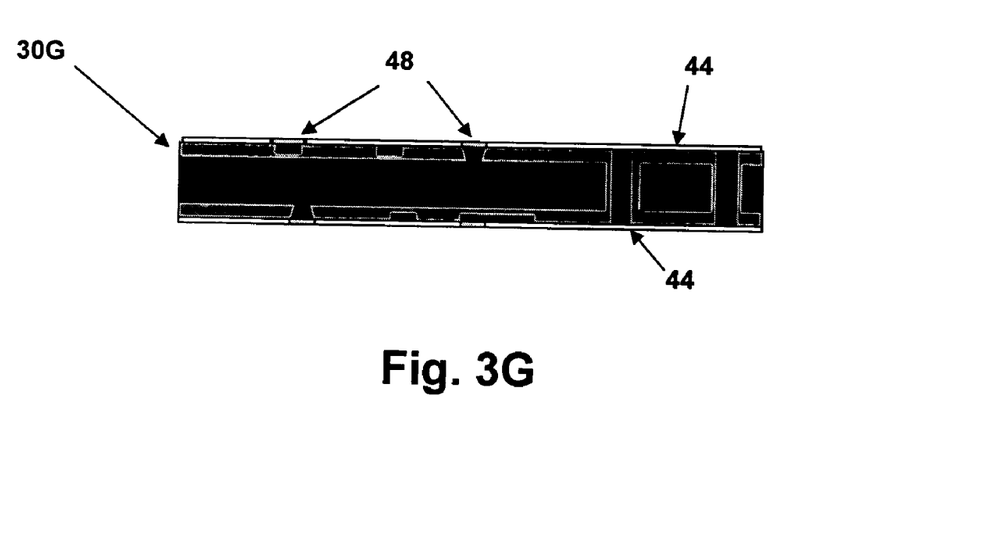

Next, a conformal coating 44 is applied to both sides of substrate state 30D and cured, yielding coated substrate stage 30E. Then, only terminal areas (wire bond lands and solder ball lands) are laser-ablated in conformal coating 44 to expose the terminal connection areas for solder ball and wire-bond lands 46. Next, plating 48 is applied to the exposed terminals (generally Ni/Au) to provide wire-bondable and solderable surfaces for attachment of wires and/or solder balls forming final substrate 30G.

Nickel-Gold is generally used to provide a barrier migration layer and to provide electrical contact for wire or chip bonding in subsequent manufacturing steps. In general, silver-nickel is an appropriate electroplating material and if a silver paste was used to form conductive channels 42A, blind vias 40A and through vias 38A, plating may not be needed to provide solderable conductive connections, but may be added to eliminate oxidation.

Figure 4A:
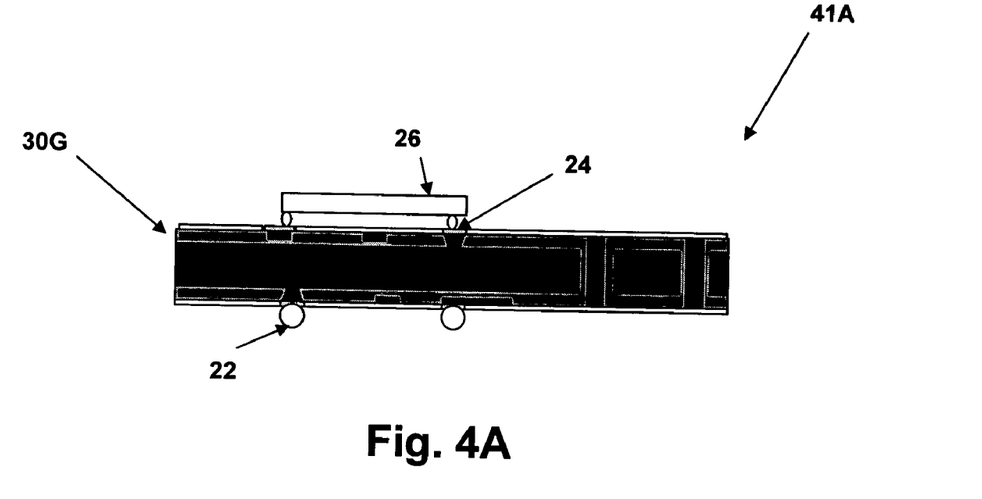
FIGS. 4A and 4B are pictorial diagrams depicting integrated circuits in accordance with other embodiments of the present invention.

Referring now to FIG. 4A, an integrated circuit 21A, in accordance with an embodiment of the invention is shown. A die 26 is mounted on substrate 30G via a plurality of solder balls or posts 24 in a flip-chip configuration. External terminal solder balls 22 are added to the external terminal locations forming a complete integrated circuit package that may be subsequently encapsulated.

Figure 4B:
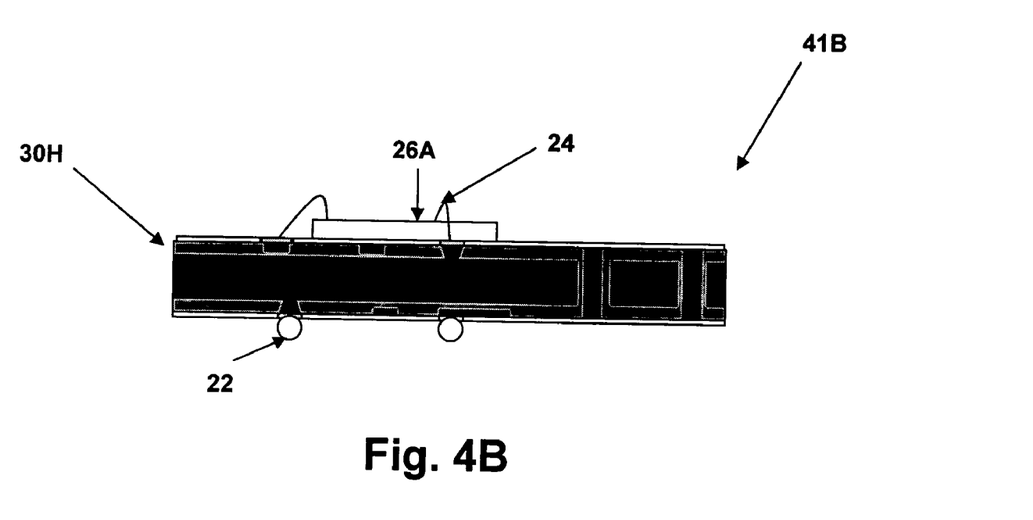

Referring now to FIG. 4B, another integrated circuit 41B is shown exemplifying a wire bonded configuration. Die 26A is mounted to substrate 30H with an adhesive (generally epoxy) and wires 24A are bonded between plated lands on the conductive pattern side of substrate 30H. Solder balls 22 are added to the external terminal locations. Substrate 30H is manufactured according to the same steps as substrate 30G, but has a different circuit pattern and die mounting area for accommodating wire-attach type die 26A.

The above description of embodiments of the invention is intended to be illustrative and not limiting. Other embodiments of this invention will be obvious to those skilled in the art in view of the above disclosure and fall within the scope of the present invention.

What is claimed is:

1. A method for manufacturing an integrated circuit substrate, comprising:
    forming a conductive circuit pattern on a first side of a dielectric layer, wherein the conductive circuit pattern includes a plurality of connection attachment terminals; and
    laser-drilling a plurality of perforations from one side of the dielectric layer through to the conductive circuit pattern to expose the connection attachment terminals.

2. The method of claim 1, wherein the laser-drilling drills the perforations through a second side of the dielectric layer to expose a bottom side of the conductive circuit pattern.

3. The method of claim 2, further comprising prior to the laser-drilling, dip plating the integrated circuit substrate, to plate the exposed conductive circuit pattern, whereby the terminals exposed by the laser drilling remain unplated.

4. The method of claim 3, further comprising applying an organic solderable protectant to the exposed terminals.

5. The method of claim 1, further comprising:
    applying a conformal coating over the conductive circuit pattern; and
    curing the conformal coating, and wherein the laser drilling exposes the connection attachment terminals after the curing.

6. A method for manufacturing an integrated circuit substrate, comprising:
    applying a conformal coating over a conductive circuit pattern disposed at the surface of a dielectric layer of the substrate;
    laser-ablating the conformal coating only above terminal areas of the conductive circuit pattern, whereby only the terminal areas are exposed; and
    electro-less plating the substrate, whereby the conformal coating prevents plating any of the conductive circuit pattern except for the terminal areas.

7. The method of claim 6, further comprising:
    prior to the applying, first laser-ablating features within the dielectric layer from the surface of the dielectric layer; and
    filling the features with metal, whereby conductive features are formed within the dielectric layer.

8. The method of claim 7, wherein the first laser-ablating laser drills through the dielectric layer to form a via hole, whereby a via is formed by the filling.

9. The method of claim 8, further comprising prior to the applying, attaching the dielectric layer to a metal layer, and wherein the first laser-ablating drills through the dielectric layer to form a blind via hole terminating at the metal layer, whereby an electrical connection to the metal layer is formed by the filling.

10. The method of claim 8, further comprising prior to the applying, attaching the dielectric layer to a metal layer, and wherein the first laser-ablating drills through the dielectric layer and the metal layer to form a through via hole passing through at the metal layer, whereby an electrical connection to an opposite side of the metal layer is provided by the filling.

11. The method of claim 7, wherein the first laser-ablating forms channels within the dielectric layer, the channels extending from the surface of the dielectric layer to a channel bottom above an opposite surface of the dielectric layer, whereby a conductive pattern is formed by the filling.

12. The method of claim 6, further comprising prior to the applying, attaching the dielectric layer to a first surface of a metal layer by laminating the dielectric layer onto the metal layer with an adhesive.

13. The method of claim 12, further comprising prior to the applying, laminating a second dielectric layer to a second surface of the metal layer.

14. The method of claim 13, further comprising prior to the applying:
    first laser-ablating, features within the dielectric layer from outer surfaces of both dielectric layers; and
    filling the features with metal, whereby conductive features are formed within each of the dielectric layers.

15. The method of claim 6, further comprising:
    prior to the applying, injection-molding a dielectric material around the metal layer;
    first laser-ablating the injection-molded dielectric material to form features on both sides of the dielectric material and within the dielectric material; and
    filling the features with conductive material, whereby conductive patterns are formed on both sides of the substrate.

16. A method for manufacturing an integrated circuit substrate, comprising:
    forming a conductive circuit pattern on a first side of a dielectric layer, wherein the conductive circuit pattern includes a plurality of connection attachment terminals;
    laser-drilling a plurality of perforations from a second side of the dielectric layer through to a bottom side of the conductive circuit pattern to expose the connection attachment terminals.

17. The method of claim 16, further comprising prior to the laser-drilling, dip-plating the conductive pattern, whereby the laser-drilling exposes unplated connection attachment.

18. The method of claim 17, further comprising punching only tool sprocket holes through the dielectric layer prior to the forming, whereby any portion of the conductive circuit pattern in contact with terminal vias of the substrate are not plated by the dip-plating.

19. The method of claim 16, further comprising prior to the forming, laminating a conductive layer to the first side of the dielectric layer, and wherein the forming is performed by photo-etching the conductive pattern from the conductive layer.

20. The method of claim 19, further comprising prior to the forming, plating the conductive layer to form a protective metal plating layer over the conductive pattern, and wherein the laser-drilling is performed subsequent to the plating, whereby the connection attachment terminals remain unplated.

* * * * *